(12) United States Patent
Cheng et al.

(10) Patent No.: US 12,193,167 B2
(45) Date of Patent: Jan. 7, 2025

(54) METHOD OF MANUFACTURING AN ELECTRONIC DEVICE

(71) Applicant: Innolux Corporation, Miaoli County (TW)

(72) Inventors: Kai Cheng, Miaoli County (TW); Fang-Ying Lin, Miaoli County (TW); Tsau-Hua Hsieh, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 18/495,763

(22) Filed: Oct. 27, 2023

(65) Prior Publication Data
US 2024/0057264 A1    Feb. 15, 2024

Related U.S. Application Data (62) Division of application No. 17/752,868, filed on May 25, 2022, now Pat. No. 11,856,710.

(51) Int. Cl.

| | |
|---|---|
| *H10K 71/00* | (2023.01) |
| *H01L 21/00* | (2006.01) |
| *H01L 21/48* | (2006.01) |
| *H01L 23/00* | (2006.01) |
| *H01L 23/48* | (2006.01) |
| *H01L 23/544* | (2006.01) |
| *H01L 25/18* | (2023.01) |
| *H01L 27/12* | (2006.01) |
| *H01L 33/12* | (2010.01) |
| *H01L 33/16* | (2010.01) |
| *H01L 33/30* | (2010.01) |
| *H01L 33/32* | (2010.01) |
| *H01L 33/38* | (2010.01) |
| *H01L 33/62* | (2010.01) |
| *H05K 1/00* | (2006.01) |
| *H05K 1/02* | (2006.01) |

(Continued)

(52) U.S. Cl.
CPC .............. *H05K 3/301* (2013.01); *H05K 1/183* (2013.01); *H05K 2203/16* (2013.01)

(58) Field of Classification Search
USPC ........ 361/347, 715, 773, 789; 257/347, 715; 710/52, 53, 55, 56, 109; 711/100, 138, 711/147, 154; 29/432, 601, 704, 739, 29/740, 761, 792, 825; 438/28, 107
See application file for complete search history.

(56) References Cited

U.S. PATENT DOCUMENTS

| | | | |
|---|---|---|---|
| 6,629,051 B2 * | 9/2003 | Tanaka | G06T 7/0002 702/81 |
| 10,721,847 B2 * | 7/2020 | Hoshikawa | H05K 13/082 |

(Continued)

*Primary Examiner* — Xiaoliang Chen
(74) *Attorney, Agent, or Firm* — JCIPRNET (57) ABSTRACT

A method of manufacturing an electronic device including the following steps is provided herein. A plurality of first electronic components is provided. The plurality of first electronic components is transferred onto a plurality of pickup sites. An empty pickup site from the plurality of pickup sites may be figured out, wherein the plurality of first electronic components is absent at the empty pickup site. A second electronic component is transferred onto the empty pickup site. A target substrate is provided. The plurality of first electronic components and the second electronic component are transferred onto the target substrate.

10 Claims, 9 Drawing Sheets

(51) Int. Cl.
  *H05K 1/16* (2006.01)
  *H05K 1/18* (2006.01)
  *H05K 3/30* (2006.01)
  *H10K 71/70* (2023.01)

(56) References Cited

U.S. PATENT DOCUMENTS

| | | | | |
|---|---|---|---|---|
| 2005/0263718 | A1* | 12/2005 | Tsujino | G06K 15/1214 |
| | | | | 250/483.1 |
| 2006/0113595 | A1* | 6/2006 | Ohkawara | H01L 21/67132 |
| | | | | 257/347 |
| 2006/0203232 | A1* | 9/2006 | Okita | G03F 7/70591 |
| | | | | 356/601 |
| 2008/0014073 | A1* | 1/2008 | Moore | H01L 21/67271 |
| | | | | 414/796 |
| 2010/0032262 | A1* | 2/2010 | Im | G01R 31/2893 |
| | | | | 324/754.21 |
| 2012/0251928 | A1* | 10/2012 | Tanabe | G03F 1/84 |
| | | | | 430/5 |
| 2016/0093600 | A1* | 3/2016 | Bower | H01L 25/0753 |
| | | | | 257/89 |
| 2017/0140961 | A1* | 5/2017 | Sasaki | H01L 33/62 |
| 2017/0346011 | A1* | 11/2017 | Danesh | H10K 71/00 |
| 2018/0158706 | A1* | 6/2018 | Hsu | H01L 21/67288 |
| 2018/0261582 | A1* | 9/2018 | Henry | H01L 33/62 |
| 2019/0276308 | A1* | 9/2019 | Hsu | B81C 1/00349 |
| 2019/0371868 | A1* | 12/2019 | Chaji | H10K 59/121 |
| 2020/0020825 | A1* | 1/2020 | Yang | H01L 33/12 |
| 2020/0321489 | A1* | 10/2020 | Wang | H01L 33/0095 |
| 2021/0175390 | A1* | 6/2021 | Wang | H01L 33/0093 |
| 2022/0223754 | A1* | 7/2022 | Ahn | H01L 33/38 |
| 2023/0387084 | A1* | 11/2023 | Nakagawa | H01L 25/0753 |

* cited by examiner

METHOD OF MANUFACTURING AN ELECTRONIC DEVICE

CROSS-REFERENCE TO RELATED APPLICATION

This application is a divisional application of and claims the priority benefit of U.S. application Ser. No. 17/752,868, filed on May 25, 2022. The entirety of the above-mentioned patent application is hereby incorporated by reference herein and made a part of this specification.

BACKGROUND

Technical Field

The disclosure is related to a method of manufacturing an electronic device.

DESCRIPTION OF RELATED ART

Electronic components usually required to be bonded to a target substrate for utilization. For manufacture efficiency, a mass transferring technique is provided so that a batch of electronic components is able to be transferred onto the target substrate through one transferring step. Currently, the efficiency of the mass transferring technique and the transferring yield rate of the electronic components are expected to be improved.

SUMMARY

The disclosure is directed to a method of manufacturing an electronic device that achieves an improved yield rate.

An embodiment of the disclosure directs to a method of manufacturing an electronic device including providing a plurality of first electronic components; transferring the plurality of first electronic components onto a plurality of pickup sites; figuring out an empty pickup site from the plurality of pickup sites, wherein the plurality of first electronic components is absent at the empty pickup site; transferring a second electronic component onto the empty pickup site; providing a target substrate; and transferring the plurality of first electronic components and the second electronic component onto the target substrate.

Another embodiment of the disclosure directs to a method of manufacturing an electronic device including providing a plurality of first electronic components; transferring the plurality of first electronic components onto a plurality of pickup sites; figuring out a defected electronic component from the plurality of first electronic components; removing the defected electronic component to provide an empty pickup site among the plurality of pickup sites; transferring a second electronic component onto the empty pickup site; providing a target substrate; and transferring the plurality of first electronic components and the second electronic component onto the target substrate.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

"A structure (or layer, component, substrate, etc.) being located on/above another structure (or layer, component, substrate, etc.)" as described in the disclosure may mean that the two structures are adjacent and directly connected, or may mean that the two structures are adjacent but are not directly connected. "Not being directly connected" means that at least one intermediate structure (or intermediate layer, intermediate component, intermediate substrate, intermediate interval, etc.) is present between the two structures, where the lower surface of one structure is adjacent or directly connected to the upper surface of the intermediate structure, the upper surface of the other structure is adjacent or directly connected to the lower surface of the intermediate structure, and the intermediate structure may be composed of a single-layer or multi-layer physical structure or non-physical structure and is not specifically limited herein. In the disclosure, when one structure is disposed "on" another structure, it may mean that the one structure is "directly" on the another structure, or may mean that the one structure is "indirectly" on the another structure (i.e., at least one other structure is interposed between the one structure and the another structure).

Electrical connection or coupling as described in the disclosure may both refer to direct connection or indirect connection. In the case of direct connection, the terminal points of two components on the circuit are directly connected or are connected to each other via a conductor line segment. In the case of indirect connection, a switch, a diode, a capacitor, an inductor, a resistor, another suitable component, or a combination of the above components is present between the terminal points of two components on the circuit. However, the disclosure is not limited thereto.

In the disclosure, the length and width may be measured by an optical microscope, and the thickness may be measured according to a cross-sectional image in an electron microscope, but the disclosure is not limited thereto. In addition, there may be a certain error between any two values or directions used for comparison. If a first value is equal to a second value, it is implied that there may be an error of about 10% between the first value and the second value; if a first direction is perpendicular to a second direction, the angle between the first direction and the second direction may be 80 degrees to 100 degrees; and if the first direction is parallel to the second direction, the angle between the first direction and the second direction may be 0 degrees to 10 degrees.

In the disclosure, the embodiments to be described below may be used in combination as long as such combination does not depart from the spirit and scope of the disclosure. For example, part of the features of an embodiment may be combined with part of the features of another embodiment to form still another embodiment.

Reference will now be made in detail to the exemplary embodiments of the disclosure, examples of which are illustrated in the accompanying drawings. Whenever possible, the same reference numerals are used to represent the same or similar parts in the accompanying drawings and description.—

The method of manufacturing an electronic device disclosed herein may be applicable to an electronic device including a display device, an antenna device, a sensing device or a tiled device, but the present disclosure is not limited thereto. The electronic device may include a bendable electronic device or a flexible electronic device. The electronic device may, for example, include a liquid crystal or a light emitting diode; the light emitting diode may, for example, include an organic light emitting diode (OLED), a sub-millimeter light emitting diode (mini LED), a micro light emitting diode (micro LED) or a quantum dot (QD) light emitting diode (for example, QLED or QDLED), fluorescence, phosphor or other suitable materials, and the materials may be optionally combined, but the present disclosure is not limited thereto. The antenna device may be, for example, a liquid crystal antenna, but the present disclosure is not limited thereto. The tiled device may be, for example, a display tiled device or an antenna tiled device, but the present disclosure is not limited thereto. It should be noted that the electronic device may be the optional combination of the above, but the present disclosure is not limited thereto.

In the description and the claims of the disclosure, the terms using the ordinal numbers, such as the first, the second or the like are used for indicating the respective elements. For example, the purpose of using the ordinal numbers is to separate one element from another element since the elements have the same term. In the disclosure, the first and the second may be used to separately indicate an electronic component before repair and another electronic component after repair. In some embodiments, the first and the second electronic component may have substantially the same property, and for example, the first and the second electronic components are LEDs.

Figure 1:
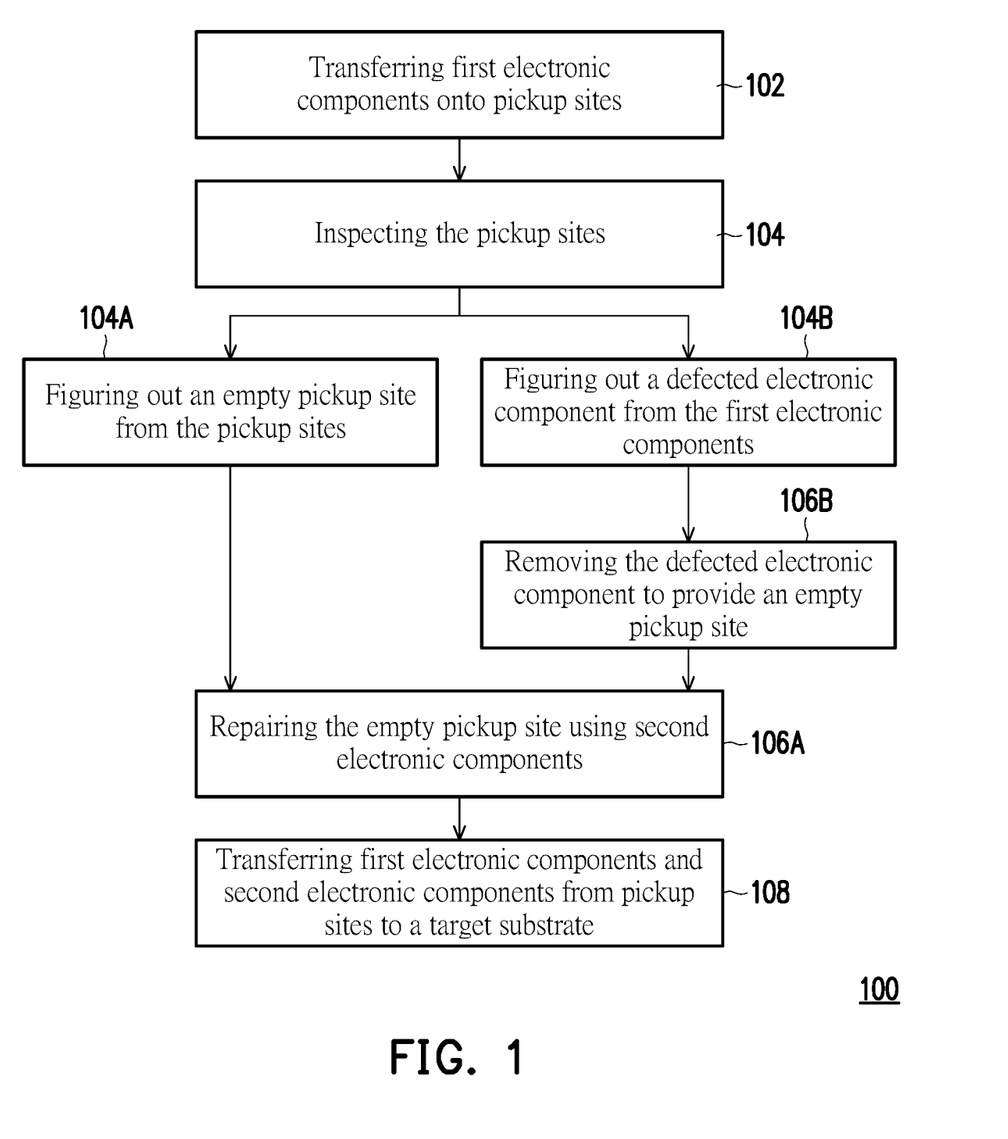
FIG. 1 schematically illustrates a flow chart of a method of manufacturing an electronic device in accordance with some embodiments of the disclosure.

FIG. 1 schematically illustrates a flow chart of a method of manufacturing an electronic device in accordance with some embodiments of the disclosure. The method 100 may include the following steps, but not limit thereto. In some embodiments, the method 100 may include other steps that are not described explicitly herein. The method 100 may be utilized as a mass transferring for a plurality of electronic components such as micro-LEDs, mini-LEDs, LEDs, active components, passive components or the like. For example, the method 100 relates to the technique of transferring a batch of electronic components to a target substrate simultaneously with an improved yield rate.

In a block 102, a plurality of first electronic components may be transferred onto a plurality of pickup sites. In some embodiments, a transfer head having the pickup sites is used for transferring the first electronic components. In other words, the pickup sites are located and formed on the transfer head. The transfer head is a tool that is able to pick up a plurality of first electronic components by the pickup sites at the same time, move the first electronic components to predetermined positions and release the first electronic components onto a target substrate so as to complete the transferring process. In some embodiments, the first electronic components are arranged and provided on a carrier in advance and are transferred onto the pickup sites of the transfer head. For example, the transfer head may pick up the first electronic components from the carrier using the pickup sites and carry the first electronic components to predetermined positions. In some embodiments, attractive force may be provided at the pickup sites of the transfer head so that the first electronic components are temporarily attached onto the pickup sites. The attractive force may include static-electricity force, adhesive force, vacuum force or the like. For example, the plurality of first electronic components may be transferred onto the pickup sites through a static-electricity transferring, a stamp transferring, or a vacuum transferring. In the embodiment, the first electronic components may refer to the electronic components that are initially transferred to the pickup sites of the transfer head.

In a block 104, the pickup sites are inspected. In the embodiment, an automatic optical inspection (AOI) apparatus may be used for the inspection. For example, the automatic optical inspection apparatus may scan the transfer head to capture the images of the pickup sites with/without the first electronic components. The captured images may indicate whether an unwanted defect or an empty pickup site exists. In other embodiments, the inspection may be performed by using an alternative apparatus that is able to determine an unwanted defect at the pickup sites.

In some embodiments, as described in a block 104A, an empty pickup site may be figured out from the pickup sites through the inspection described in the block 104. Specifically, one or more pickup site among the pickup sites on the transfer head is empty without carrying an electronic component, and thus is determined as an empty pickup site or empty pickup sites. As described in above, the first electronic components are transferred onto the pickup sites from a carrier. In some embodiments, the arrangement of the first electronic components on the carrier is not properly corresponding to the pickup sites, so that one or more pickup site may fail to pick up an electronic component so as to serve as an empty pickup site. In some embodiments, the attractive force for transferring the first electronic components to the pickup sites is not properly provided, so that one or more pickup site may fail to pick up an electronic component so as to serve as an empty pickup site. Alternatively, the empty pickup site may exist because the electronic component carried by the corresponding pickup site falls or is intentionally removed while other first electronic components remain on the corresponding pickup sites.

Once one or more empty pickup site is figured out, a step of repairing the empty pickup site as described in a block 106A is performed. Specifically, a second electronic component, i.e. another electronic component for repair, is provided and transferred onto the empty pickup site. The electronic component for repair may have the same design as the first electronic components that are already attached onto other pickup sites. In some embodiments, the electronic component for repair may be carried by another carrier in advance and transferred onto the empty pickup site through a laser releasing method. For example, the carrier with the electronic component for repair is positioned above the empty pickup site and is so oriented that the electronic component for repair faces the empty pickup site. A laser irradiates the carrier at a site of the electronic component for repair and separate the electronic component for repair from the carrier. Thus, the electronic component for repair can be transferred onto the empty pickup site. In some embodiments, the electronic component for repair may be transferred onto the empty pickup site through an alternative method, and the disclosure is not limited thereto. After repairing the empty pickup site, the inspection as described in the block 104 may be further performed to ensure all the pickup sites carry the electronic components, including the first electronic components and the second electronic components.

In some embodiments, as described in a block 104B, a defected electronic component may be figured out from the first electronic components through the inspection of the block 104. For example, through the inspection of the block 104, one or more electronic component among the first electronic components carried by the pickup sites may be found to have defects and thus determined as the defected electronic component. The defects of an electronic component may include improper features of the electronic component, cracks of the electronic component and/or the like that are able to be determined from the appearance of the electronic component, but the disclosure is not limited thereto.

Once one or more defected electronic component is figured out, the step described in a block 106B is performed to remove the defected electronic component to provide an empty pickup site. In some embodiments, the defected electronic component is removed from the corresponding pickup site through a laser ablation or a laser impact. For the laser ablation, a laser irradiating the defected electronic component have sufficient energy to burned the defected electronic component to empty the corresponding pickup site. For laser impact, a laser may impact the defected electronic to break the attachment between the defected electronic component and the corresponding pickup site so that the defected electronic component is separated from the corresponding pickup site to empty the corresponding pickup site. In some embodiments, the absorption/attraction force of the pickup sites of the transfer head may be independently controlled, so that the removing of the defected electronic component may be performed by reducing the individual absorption/attraction force of the pickup site occupied by the defected electronic component so as to remove the defected electronic component and empty the corresponding pickup site. After removing the defected electronic component, the empty pickup site may be repaired as indicated in the block 106A.

After the repair of the block 106A, a step of transferring the electronic components (including, the first electronic components transferred in the block 102 and the second electronic components transferred in the block 106A) from the pickup sites onto a target substrate is performed as described in a block 108. In the method 100, the first electronic components and the second electronic components are transferred onto the target substrate from the carrier using the transfer head having the pickup sites. For example, the pickup sites of the transfer head can be all occupied by the first electronic components and the second electronic components, i.e. no empty pickup site exists. In some embodiments, the inspection of the block 104 is repeated until all the first electronic components and the second electronic components on the pickup sites pass the inspection of the block 104A and/or the block 104B prior to being transferred to the target substrate, which improve the yield rate of the method of manufacturing an electronic device. In some embodiments, the transferring yield rate of the method 100 may be 99.9999% or proximate to 100% since every pickup site carries and transfers a good electronic component to the target substrate. The transferring yield rate may be determined based on the ratio of the good electronic components among the electronic components transferred on the target substrate through one single transferring process, e.g. performing the method 100 one single time. Herein, the so-called good electronic components are the electronic components having no defect that is able to be inspected through the inspection described in the block 104. In the disclosure, the first electronic components and the second electronic components refer to the same type of electronic components that are predetermined to be bonded to the target substrate for providing the required effect while the "first" electronic components are initially transferred to the pickup sites of the transfer head in the block 102 before the inspection described in the block 104 and the "second" electronic components are electronic components for repair that are transferred to the pickup sites of the transfer head in the block 106A after the inspection described in the block 104.

Figure 2:
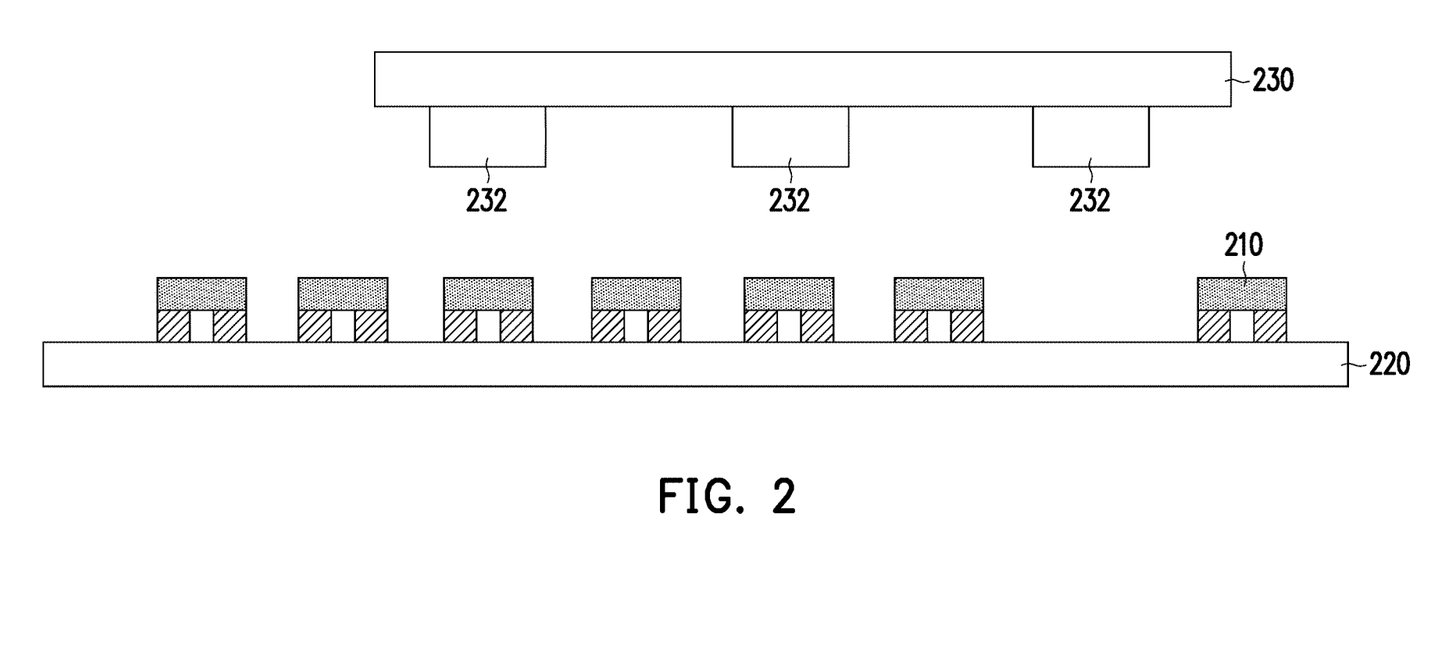
FIG. 2 to FIG. 7 schematically illustrate a method of manufacturing an electronic device in accordance with some embodiments.

FIG. 2 to FIG. 7 schematically illustrate a method of manufacturing an electronic device in accordance with some embodiments. In FIG. 2, a plurality of first electronic components 210 are provided and specifically, the first electronic components 210 are arranged on and carried by a carrier 220 in advance. A transfer head 230 having a plurality of pickup sites 232 is also provided for transferring the first electronic components 210. The transfer head 230 is a part of a transfer machine for transferring the first electronic components 210. The pickup sites 232 of the transfer head 230 are located at the same side of the transfer head 230 and are able to pick up multiple first electronic components 210 simultaneously from the carrier 220. Therefore, a mass transferring that is able to transfer a batch of the first electronic components 210 may be achieved.

In some embodiments, the arrangement of the pickup sites 232 on the transfer head 230 may be corresponding to the arrangement of the first electronic components 210 on the carrier 220. For example, the pitch of the pickup sites 232 may be equal to or a multiple of the pitch of the first electronic components 210 on the carrier 220. Therefore, each of the pickup sites 232 is predetermined to pick up one of the first electronic components 210 on the carrier 220. In FIG. 2, the exemplarily example provided herein shows that the pitch of the pickup sites 232 is twice of the pitch of the first electronic components 210 on the carrier 220, but the disclosure is not limited thereto. In some embodiments, the pitch of the pickup sites 232 and the pitch of the first electronic components 210 on the carrier 220 may be determined based on the design of the final product.

Figure 3:
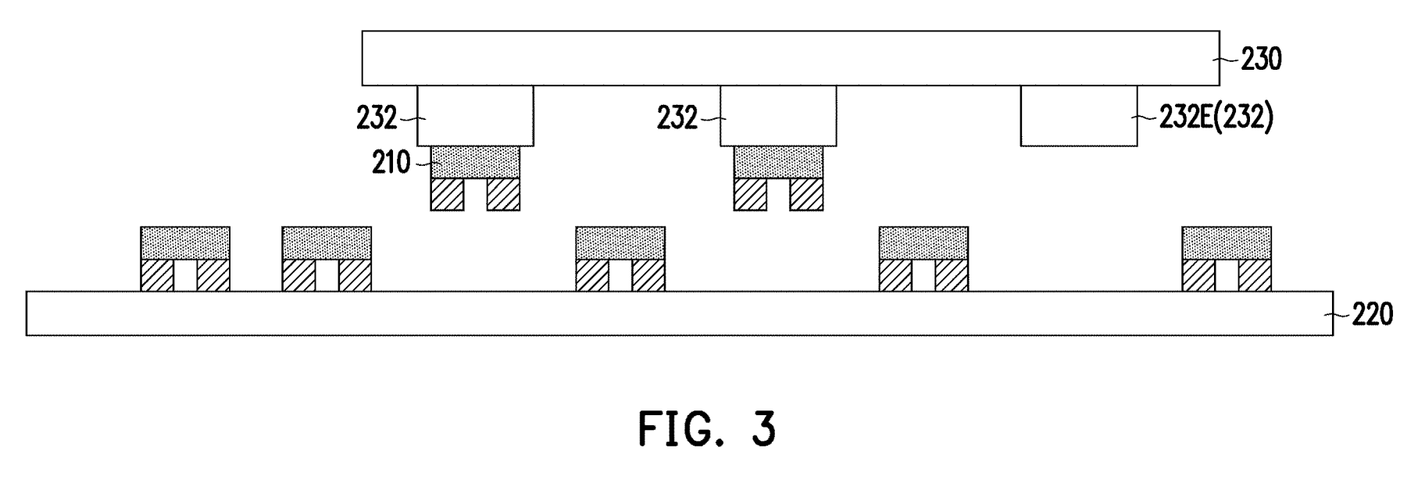

In FIG. 3, the first electronic components 210 are transferred to the pickup sites 232 from the carrier 220, similar to the transferring step depicted in the block 102 of FIG. 1. It can be known that the electronic components described in the block 102 of FIG. 1 can refer to the first electronic components 210. Therefore, the first electronic components 210 may refer to the electronic components initially transferred to the pickup sites 232. Specifically, the transfer head 230 may move toward the carrier 220 to enable the pickup sites 232 to touch and/or pick up the corresponding first electronic components 210. For example, an attractive force may be generated at the pickup sites 232 when the pickup sites 232 are adjacent to and/or touch the corresponding first electronic components 210 on the carrier 220 so that the corresponding first electronic components 210 are attached to the pickup sites 232 of the transfer head 230 and separated from the carrier 220. In some embodiments, the attractive force includes static-electricity force, adhesive force, vacuum force, etc. Accordingly, the first electronic components 210 are transferred onto the plurality of pickup sites 232 through a static-electricity transferring, a stamp transferring, or a vacuum transferring, but the disclosure is not limited thereto. The first electronic components 210 may be temporarily attached to the pickup sites 232 and able to be released from the pickup sites 232 in the subsequent step.

After the first electronic components 210 are transferred to the pickup sites 232, the inspection described in the block 104 of FIG. 1 is performed. In FIG. 3, the exemplarily example provided herein shows that one of the pickup sites 232 fails to carry a corresponding first electronic component 210. Therefore, an empty pickup site 232E may be figured out as described in the block 104A of FIG. 1 and the empty pickup site 232E is considered as a defect of the method of manufacturing an electronic device. In some embodiments, the empty pickup site 232E may exist owing that the corresponding location of the carrier 220 is absent of an electronic component 210. In some embodiments, the empty pickup site 232E may exist owing that the electronic component 210 to be transferred by the empty pickup site 232E drops during the transferring step described in the block 102 of FIG. 1. In some embodiments, the empty pickup site 232E may exist owing to other reasons. For example, the electronic component on the corresponding pickup site may be removed intentionally, but not limited thereto.

Figure 4:
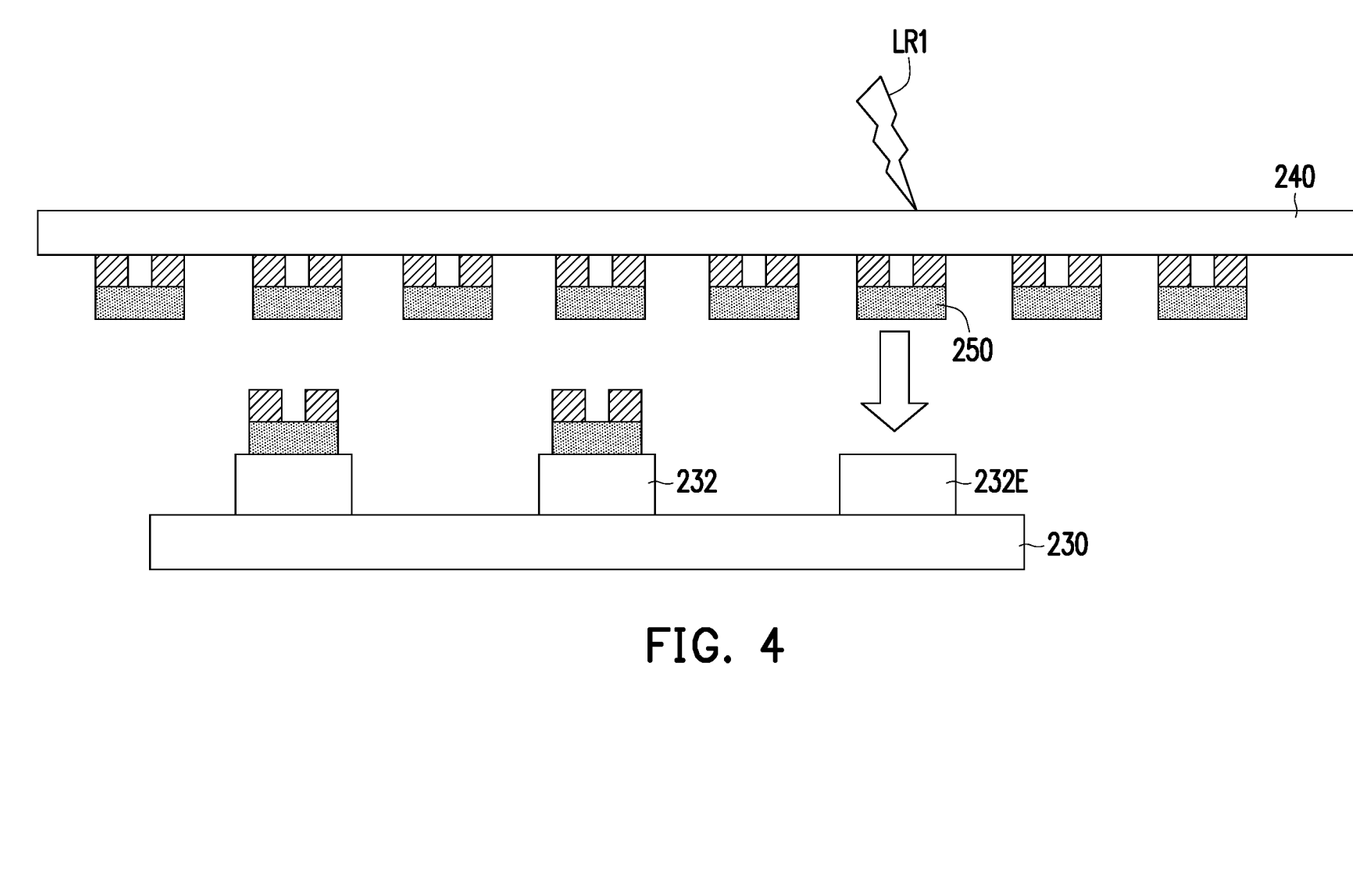
Figure 5:
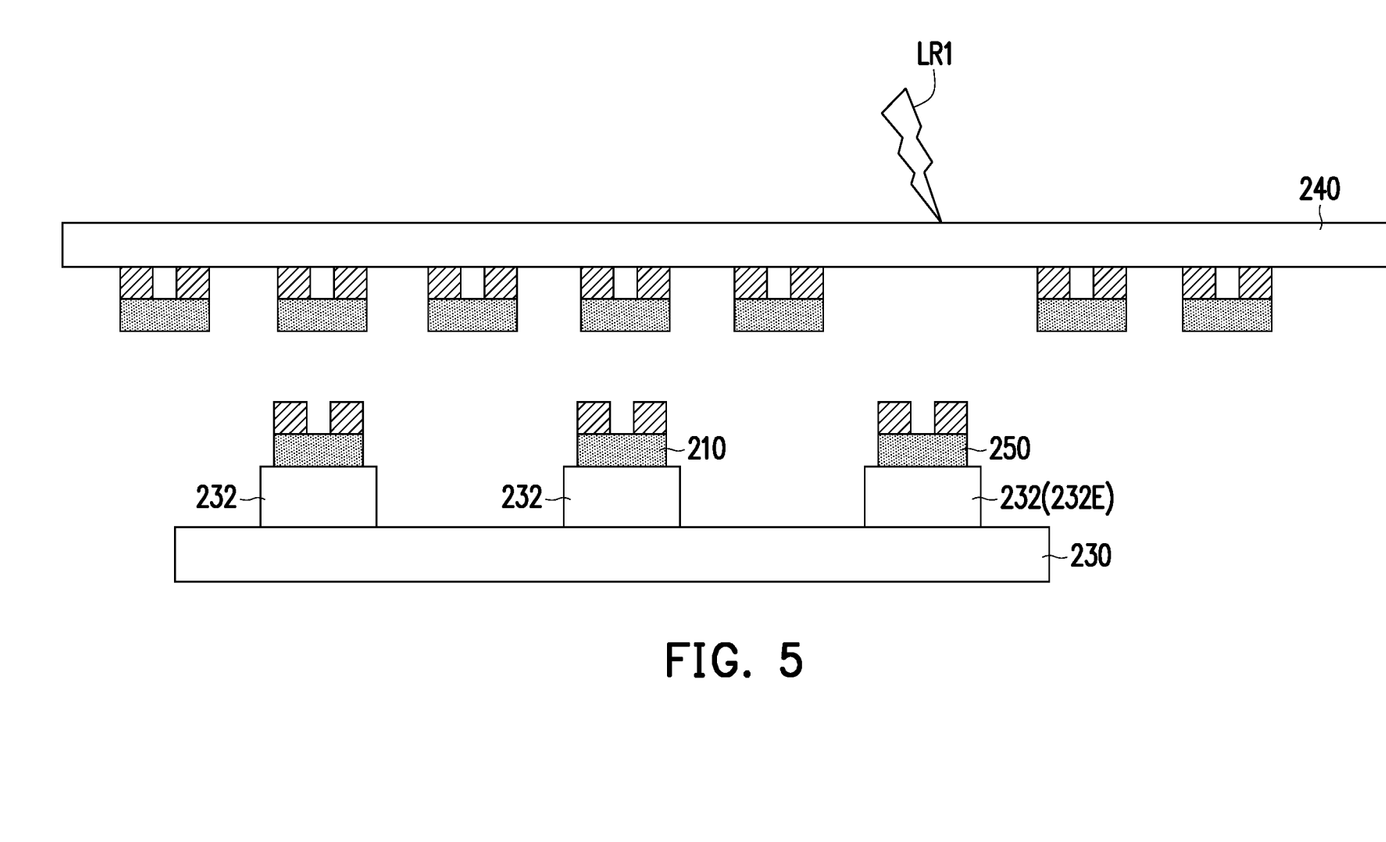

In FIG. 4 and FIG. 5, the empty pickup site 232E may be repaired as described in the block 106A of FIG. 1. In FIG. 4, a carrier 240 carrying a plurality of second electronic components 250 is provided. The second electronic components 250 carried by the carrier 240 may be the same as the first electronic components 210 carried by the carrier 220 in FIG. 2 and FIG. 3. In some embodiments, the first electronic components 210 on the carrier 220 in FIG. 2 and FIG. 3 may not be completely transferred to the transfer head 230 so that the carrier 220 carrying the remaining first electronic components 210 may be served as the carrier 240 with the second electronic components 250 in FIG. 4 and FIG. 5 for repair the empty pickup site 232E.

In FIG. 4, the carrier 240 carrying the second electronic component 250 is so oriented that the second electronic component 250 is located above the empty pickup site 232E and faces the empty pickup site 232E. Under such configuration, a laser releasing method is performed by a laser LR1 irradiating the carrier 240 at the corresponding second electronic component 250. The laser LR1 would impact the carrier 240 to separate the second electronic component 250 from the carrier 240. In some embodiments, a releasing material is formed between the carrier 240 and the second electronic component 250. Therefore, the laser LR1 may deteriorate the releasing material between the carrier 240 and the second electronic component 250 so that the second electronic components 250 is separated from the carrier 240, but the disclosure is not limited thereto.

As shown in FIG. 5, the second electronic component 250 moves to the empty pickup site 232E and is attached to the empty pickup site 232E of the transfer head 230. Accordingly, the empty pickup site 232E is no longer empty and thus repaired to serve as a normal pickup site 232 carrying an electronic component, the second electronic component 250. FIG. 4 and FIG. 5 provide an exemplarily example to implement the step described in the block 106A of FIG. 1, but the disclosure is not limited thereto. In some embodiments, other alternative method for attaching the second electronic component 250 on the empty pickup site 232E is applicable in the disclosure to repair the empty pickup site 232E. In other words, the second electronic component 250 refer to the electronic component for repair that is transferred onto the corresponding pickup site 232 through the repair step for repairing the defect found by the inspection step.

In some embodiments, after repairing the empty pickup site 232E, the inspection described in the block 104 of FIG. 1 may be further performed to ensure that all the pickup sites 232 carry the corresponding electronic components, e.g. the first electronic components 210 and the second electronic component 250. If one or more further empty pickup site 232E is figured under the inspection described in the block 104 of FIG. 1, the repair described in the block 106A of FIG. 1, e.g. the steps shown in FIG. 4 and FIG. 5 is further performed until no empty pickup site 232E is found.

Figure 6:
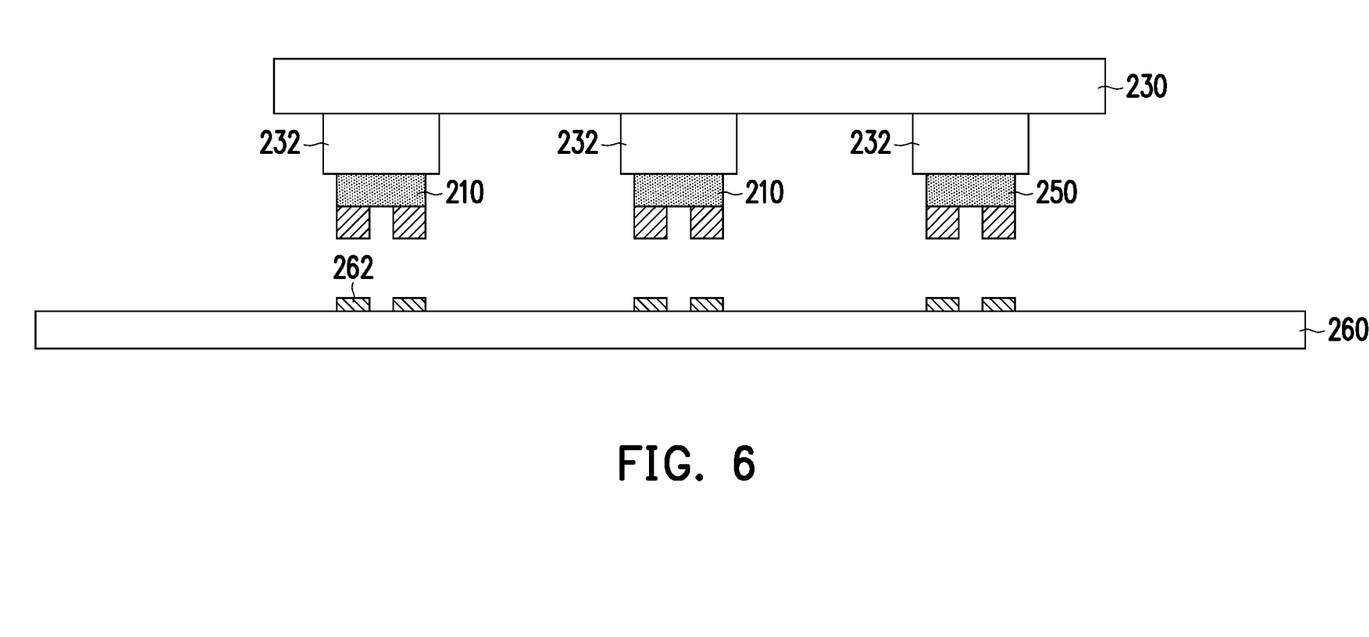

Then, the transferring described in the block 108 of FIG. 100 is performed. Specifically, as shown in FIG. 6, a target substrate 260 is provided. The target substrate 260 may be a substrate having circuitry wirings and/or driving circuitries thereon. For example, bonding pads 262 are formed and arranged on the target substrate 260. In some embodiments, the arrangement of the first electronic components 210 and the second electronic component 250 on the pickup sites 232 of the transfer head 230 is corresponding to the arrangement of the bonding pads 262 on the target substrate 260. The transfer head 230 is oriented that the first electronic components 210 and the second electronic component 250 all face the target substrate 260, and specifically, are positioned corresponding to the bonding pads 262 on the target substrate 260.

Figure 7:
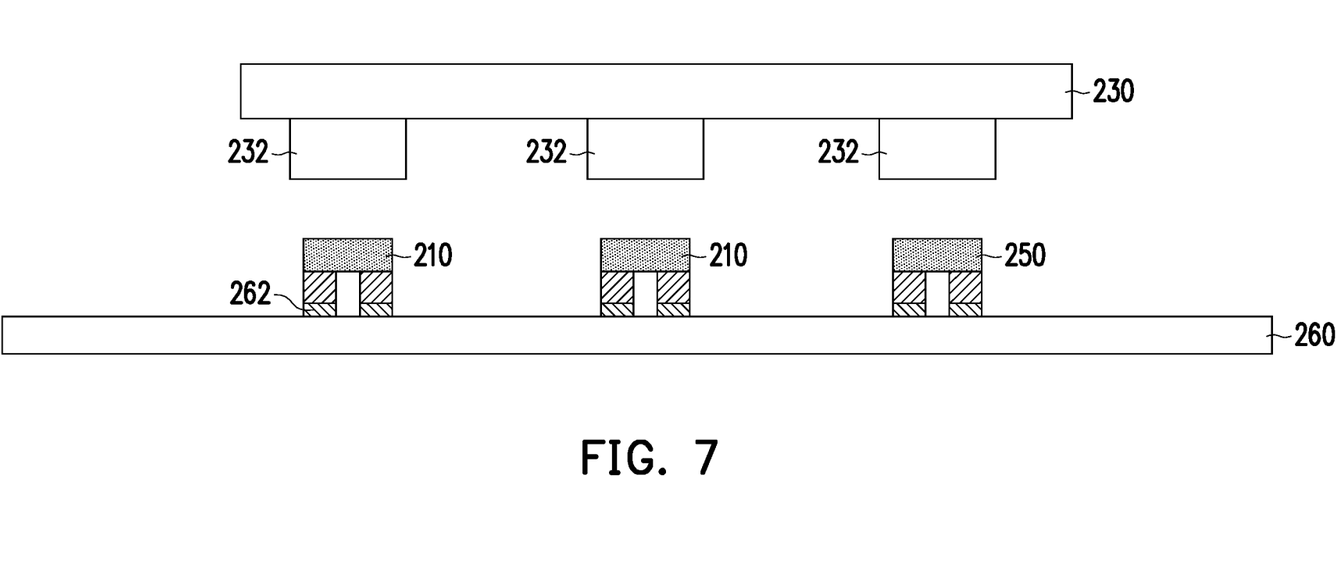

In FIG. 7, the transfer head 230 may release the first electronic components 210 and the second electronic component 250 so as to transfer the first electronic components 210 and the second electronic component 250 onto the target substrate 260 from the pickup sites 232 of the transfer head 230. In some embodiments, the first electronic components 210 and the second electronic component 250 located on the target substrate 260 may be bonded to and electrically connected to the corresponding bonding pads 262 through, for example, flip chip bonding technique or the like. The first electronic components 210 and the second electronic component 250 may be separated from the pickup sites 232 by reducing or turning off the attractive force on the pickup sites 232, or rendering the attractive force on the pickup sites 232 less than the bonding force that the first electronic components 210 and the second electronic component 250 are bonded to the bonding pads 262. Before transferring the first electronic components 210 and the second electronic component 250 onto the target substrate, the pickup sites 232 are inspected and repaired until all the pickup sites 232 carry the corresponding electronic components. Therefore, the transferring yield of transferring the electronic components on the target substrate 260 is improved. For example, in a case that the transfer head 230 has 100 pickup sites 232, the method of FIGS. 2 to 7 allows to transfer 100 electronic components to the target substrate 260 by performing the transferring described in the block 108 of FIG. 1 only once. In addition, the electronic components, i.e. the first electronic components 210 and the second electronic component 250 are inspected as described in the block 104 of FIG. 1, which ensures that the first electronic components 210 and the second electronic component 250 transferred on the target substrate 260 are good electronic components. Therefore, a transferring yield rate of about 99.9999% or higher may be achieved. In some embodiments, after the transferring described in the block 108 of FIG. 1 as well as the steps of FIGS. 6 and 7, the electronic components transferred on to the predetermined transferring region of the target substrate 260 are good components and no empty bonding pad in the predetermined transferring region of the target substrate 260 would be found so that no further transferring process and/or repairing process is required for the same predetermined transferring region of the target substrate 260. Accordingly, the method 100 of FIG. 1 as well as the method described in FIGS. 2 to 7 achieves a desirable yield rate of manufacturing an electronic device.

Figure 8:
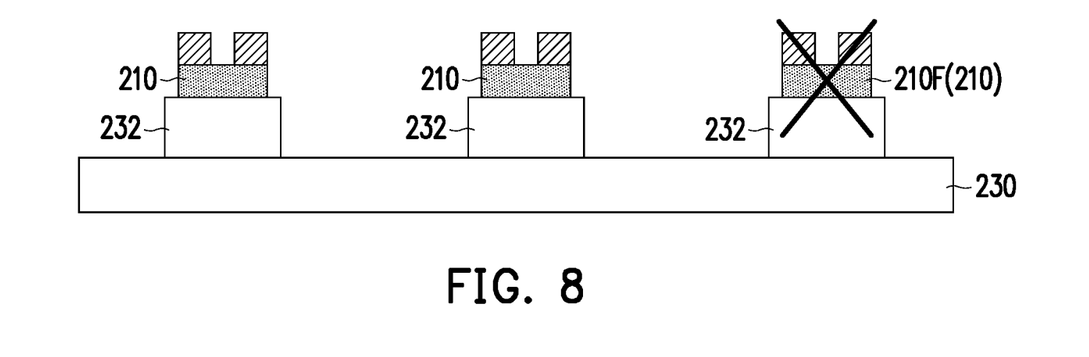
FIG. 8 to FIG. 10 schematically illustrate some steps of a method of manufacturing an electronic device in accordance with some embodiments.
Figure 9:
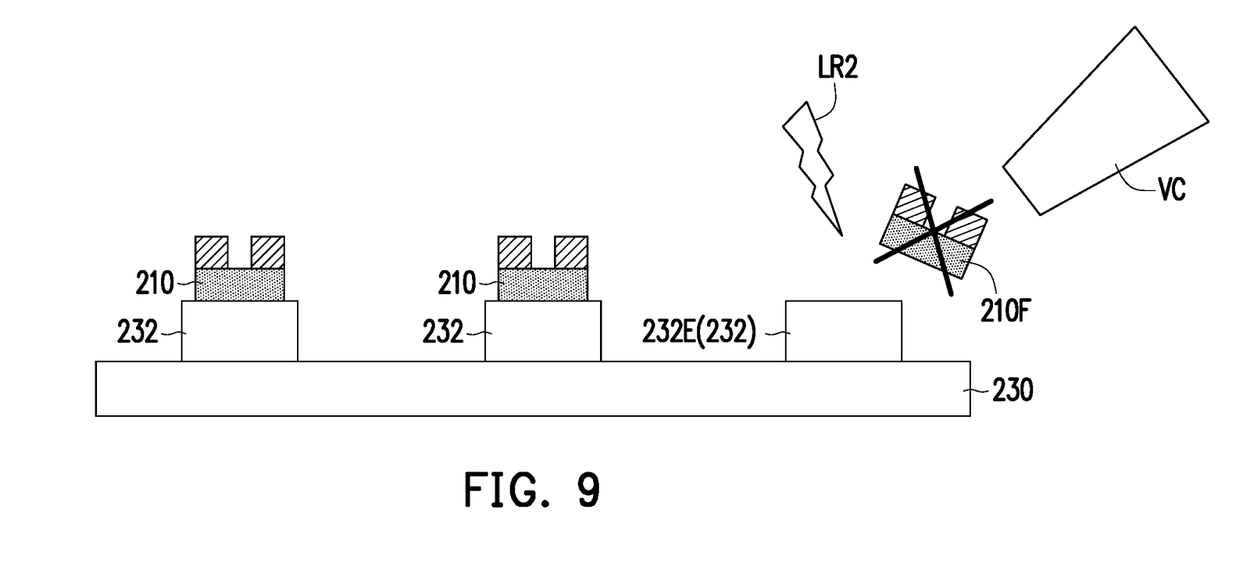
Figure 10:
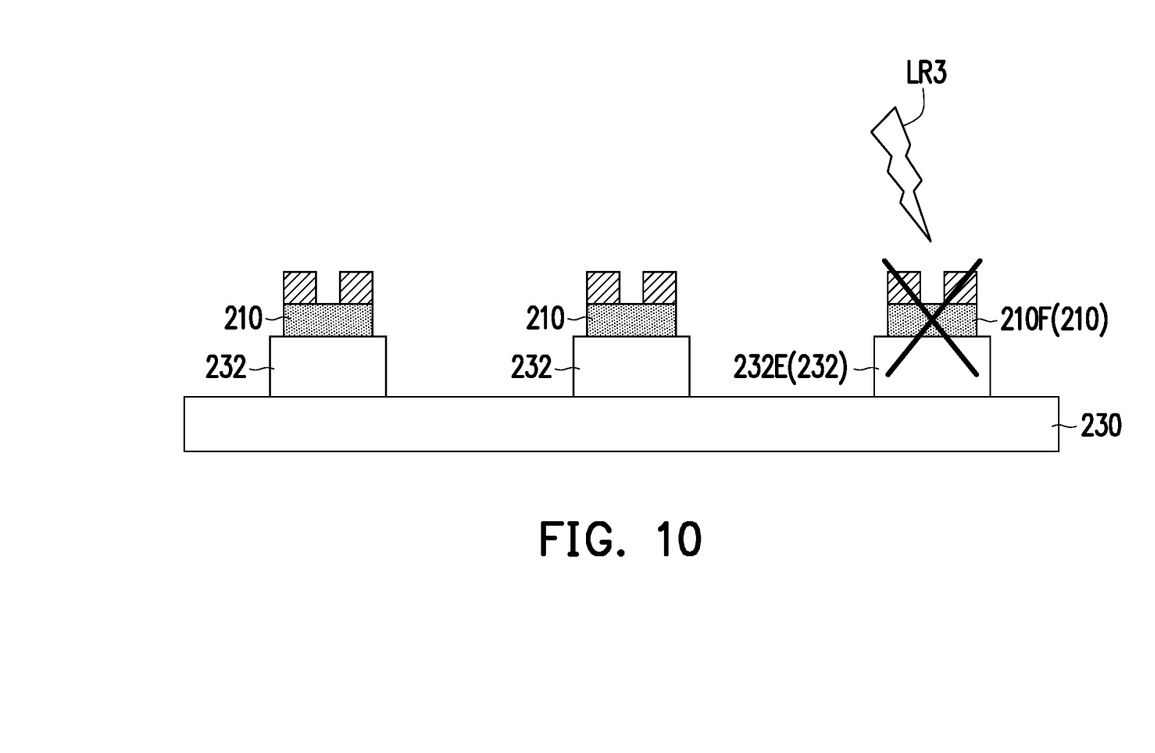

FIG. 8 to FIG. 10 schematically illustrate some steps of a method of manufacturing an electronic device in accordance with some embodiments. In some embodiments, as described in the block 104B of FIG. 1, a defected electronic component may be figured out under the inspection described in the block 104 of FIG. 1. Specifically, FIG. 8 exemplarily shows that one of the first electronic components 210 on the pickup sites 210 is found to be defected under the inspection described in the block 104 of FIG. 1. The inspection described in the block 104 of FIG. 1 may be performed by an AOI apparatus. The defected electronic component 210F may be an electronic component having cracks, improper features, or the likes that is identifiable from the image captured by the AOI apparatus.

Thereafter, the removing step described in the block 106B of FIG. 1 is performed. For example, the defected electronic component 210F may be removed through a laser impact as shown in FIG. 9. Specifically, a laser LR2 irradiates and impacts the defected electronic component 210F and a vacuum force VC may be applied to separate the defected electronic components 210F from the corresponding pickup site 232 to provide an empty pickup site 232E. As such, the state of the transfer head 230 shown in FIG. 9 is similar to that of FIG. 3. In other words, an empty pickup site 232E exists. Then, the steps of FIG. 4 to FIG. 7 may be performed after the step of FIG. 9 so as to transfer the electronic components in a batch to the target substrate 260 shown in FIG. 7 with an improved yield rate.

In some embodiments, the defected electronic component 210F may be removed through a laser ablation as shown in FIG. 10. Specifically, a laser LR3 with sufficient energy irradiates the defected electronic component 210F so that the defected electronic components 210F is burned out to empty the corresponding pickup site 232 and thus provide an empty pickup site 232E as shown in FIG. 3. Then, the steps of FIG. 4 to FIG. 7 may be performed after the step of FIG. 10 so as to transfer electronic components in a batch to the target substrate 260 shown in FIG. 7 with an improved yield rate.

According to the above embodiments, FIG. 2 and FIG. 3 may relate to the step described in the block 102 of FIG. 1. FIG. 3 may relate to the step described in the block 104A of FIG. 1. FIG. 4 and FIG. 5 may relate to the block 106A of FIG. 1. FIG. 8 may relate to the step described in the block 104B of FIG. 1. FIG. 9 and FIG. 10 may relate to the step described in the block 106B of FIG. 1. FIG. 6 and FIG. 7 may relate to the step described in the block 108 of FIG. 1. However, the disclosure is not limited thereto.

In light of the above, the embodiments of the disclosure provide a method of manufacturing an electronic device by inspecting and repairing the transferring tool such as the pickup sites prior to transferring the electronic components onto a target substrate. For example, before transferring the electronic components onto the target substrate, the inspection and the repair ensures that the pickup sites all carry the electronic components and/or ensures that the electronic components on the pickup sites are good components. Therefore, the yield rate of transferring the electronic components onto the target substrate may be proximate to 100%, e.g. about 99.9999%, which satisfies the industrial requirement in the related industry. Alternatively, the method as described in the embodiments of the disclosure may not require further transferring and/or repair step on one predetermined transferring region of the target substrate to successfully transfer good electronic components on the predetermined transferring region so that the overall yield rate of manufacturing an electronic device is improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of manufacturing an electronic device, comprising:
providing a plurality of first electronic components;
transferring the plurality of first electronic components onto a plurality of pickup sites;
figuring out a defected electronic component from the plurality of first electronic components;
removing the defected electronic component to provide an empty pickup site among the plurality of pickup sites;
transferring a second electronic component onto the empty pickup site;
providing a target substrate; and
transferring the plurality of first electronic components and the second electronic component onto the target substrate.

2. The method of manufacturing the electronic device of claim 1, wherein the plurality of first electronic components is transferred onto the plurality of pickup sites through a static-electricity transferring, a stamp transferring, or a vacuum transferring.

3. The method of manufacturing the electronic device of claim 1, wherein the second electronic component is transferred onto the empty pickup site through a laser releasing method.

4. The method of manufacturing the electronic device of claim 1, wherein the defected electronic component is removed through a laser ablation.

5. The method of manufacturing the electronic device of claim 1, wherein the defected electronic component is removed through a laser impact.

6. The method of manufacturing the electronic device of claim 1, wherein the defected electronic component is figured out from the plurality of first electronic components through an automatic optical inspection.

7. The method of manufacturing the electronic device of claim 1, wherein each of the plurality of pickup sites carries one electronic component of the plurality of first electronic components and the second electronic component before the plurality of first electronic components and the second electronic component are transferred onto the target substrate.

8. The method of manufacturing the electronic device of claim 1, wherein the plurality of first electronic components are carried by a carrier before being transferring onto the pickup sites.

9. The method of manufacturing the electronic device of claim 1, wherein the second electronic component is transferred onto the empty pickup site from a carrier.

10. The method of manufacturing the electronic device of claim 1, wherein a transfer head is used to transfer the plurality of first electronic components and the second electronic component and the transfer head has the plurality of pickup sites.

* * * * *